United States Patent [19]

Haruna et al.

[11] Patent Number: 5,194,890
[45] Date of Patent: Mar. 16, 1993

[54] IMAGING APPARATUS EQUIPPED WITH AN IMAGE GLOSSING

[75] Inventors: Akira Haruna, Nara; Iwakazu Honda, Kitakatsuragi, both of Japan

[73] Assignee: Sharp Kabushiki Kaisha, Abeno, Japan

[21] Appl. No.: 523,591

[22] Filed: May 15, 1990

[30] Foreign Application Priority Data

May 16, 1989 [JP] Japan .................................. 1-124041

[51] Int. Cl.⁵ ........................................... G03B 27/52
[52] U.S. Cl. ......................................... 355/77; 355/77
[58] Field of Search ............... 355/27, 100, 77, 30; 430/138, 211

[56] References Cited

U.S. PATENT DOCUMENTS

| | | | |
|---|---|---|---|
| 4,549,803 | 10/1985 | Ohno et al. | 355/283 |
| 4,554,235 | 11/1985 | Adair et al. | 430/138 |
| 4,576,891 | 3/1986 | Adair et al. | 430/138 X |
| 4,714,943 | 12/1987 | Sakakibara et al. | 355/27 |
| 4,872,033 | 10/1989 | Watanabe et al. | 355/27 |
| 4,905,036 | 2/1990 | Asano et al. | 355/27 |
| 4,907,030 | 3/1990 | Ogura et al. | 355/72 |
| 5,068,684 | 11/1991 | Abe et al. | 355/27 |

FOREIGN PATENT DOCUMENTS 1183659 7/1989 Japan .

Primary Examiner—W. B. Perkey
Assistant Examiner—D. Rutledge
Attorney, Agent, or Firm—David G. Conlin; Robert F. O'Connell

[57] ABSTRACT

The imaging apparatus which is provided with the image glossing device of the invention has a means for inputting or detecting a type of a receiver sheet. Transferring speed of the receiver sheet through a image glossing device after development process and temperature to which the receiver sheet is to be heated in the image glossing device are determined corresponding to the type of receiver sheet. For a receiver sheet which requires less quantity of heat for glossing, processing time can be reduced by setting relatively high heating temperature and high processing speed. For a receiver sheet which requires much quantity of heat for glossing, satisfactory glossing process can be performed without causing offset and other defects by setting relatively low heating temperature and low processing speed.

9 Claims, 9 Drawing Sheets

IMAGING APPARATUS EQUIPPED WITH AN IMAGE GLOSSING

BACKGROUND OF THE INVENTION

1. Field of the Invention

The present invention relates to improvements of an imaging apparatus which forms high gloss images on a sheet by means of a chromogenic material like a color forming dye and thermoplastic resin.

2. Description of Prior Art

In recent years imaging apparatus for image forming by means of photosensitive and pressuresensitive sheets have been developed. Such apparatus use a medium sheet and a receiver sheet. The medium sheet is coated with microcapsules of 10 to 20 micrometers in diameter which are filled with a photohardenable material and a color forming dye (for example, leuco dye). The receiver sheet is coated with a developer material (acid, etc.) which causes the color forming dye to develop the color, and a thermoplastic resin. After exposing the medium sheet to light in order to form a latent image, the receiver sheet is placed on the latent image formed on the medium sheet and is pressurized. By pressurization, microcapsules which are not hardened are broken to cause the dye to spread over the receiver sheet, thereby forming the image. The dye develops the color by reacting with the developer material on the receiver sheet to form the image.

Then by heating the receiver sheet, color developing reaction is promoted and gloss is rendered to the image by the thermoplastic resin. (These methods of the prior art are proposed in the U.S. Pat. Nos. 4,554,235 and 4,576,891.)

When heating the receiver sheet which carries the color forming dye, heat conductivity varies depending on the type of the sheet, namely the kind of material and the thickness and, consequently, the total quantity of heat required for glossing also varies. The present applicant proposed an imaging apparatus which changes the heating temperature in accordance to the kind of sheet, in the Japanese Patent Application No. 63-3375.

However, high quality images cannot be obtained unless heating is carried out at significantly high temperatures, depending on the type of sheet. On the other hand, a high temperature sustained for a long period of time causes the dye, acid, thermoplastic resin, etc. on the sheet surface to adhere to other parts of the apparatus, leading to a defect called the offset which is the transference of the dye onto the receiver sheet. Further the high-temperature sublimation of the thermoplastic resin and other materials leads to the generation of gas. Prior art includes these problems.

SUMMARY OF THE INVENTION

The present invention provides an imaging apparatus which is equipped with an image glossing device which can perform good glossing process even when the heating temperature is somewhat restricted.

The invention provides an imaging apparatus in which after the development process a receiver sheet is transferred through an image glossing device and is heated to promote color formation of a chromogenic material and to fuse thermoplastic resin, and in which a high gloss image is formed on the receiver sheet, wherein the improvement comprises:

means for inputting or detecting a type of the receiver sheet; and means for determining speed corresponding to the type of the receiver sheet to transfer the receiver sheet through the image glossing device and temperature corresponding to the type of the receiver sheet to heat the receiver sheet in the image glossing device.

In accordance to the invention, a means for inputting or detecting the type of the receiver sheet is provided. The type of receiver sheet. The quantity of heat is the product of the heating temperature and the heating time. The heating time is determined by the speed of the receiver sheet transferring or passing through the image glossing device. Increasing the processing speed i.e. transferring speed, decreases the length of heating time and decreasing the processing speed increases the length of heating time. Long periods of heating at a high temperature causes problems such as offset. In this invention, the processing speed and the heating temperature are set in accordance to the type of receiver sheet.

In case the process of glossing the receiver sheet requires less quantity of heat, the offset and other problems do not occur for a short period of heating and therefore processing speed can be increased by raising the heating temperature to a certain degree. That is, for a receiver sheet which requires less quantity of heat, processing speed can be increased by raising the heating temperature to a certain degree, thereby increasing the speed of the entire imaging process.

Also in case much quantity of heat is required for the glossing process, satisfactory glossing process is enabled without causing the offset and other problems, by decreasing the processing speed while restricting the heating temperature within a certain degree. That is, a receiver sheet which requires much quantity of heat for image glossing can be processed with sufficient supply of heat quantity by decreasing the processing speed without raising the heating temperature, and offset and gas generation due to high temperature processing can be prevented.

BRIEF DESCRIPTION OF THE DRAWINGS

These and other purposes and advantages of the invention will be more clearly understood when the detailed description that follows is read with reference to the drawings.

DETAILED DESCRIPTION OF THE PREFERRED EMBODIMENTS

Figure 1:
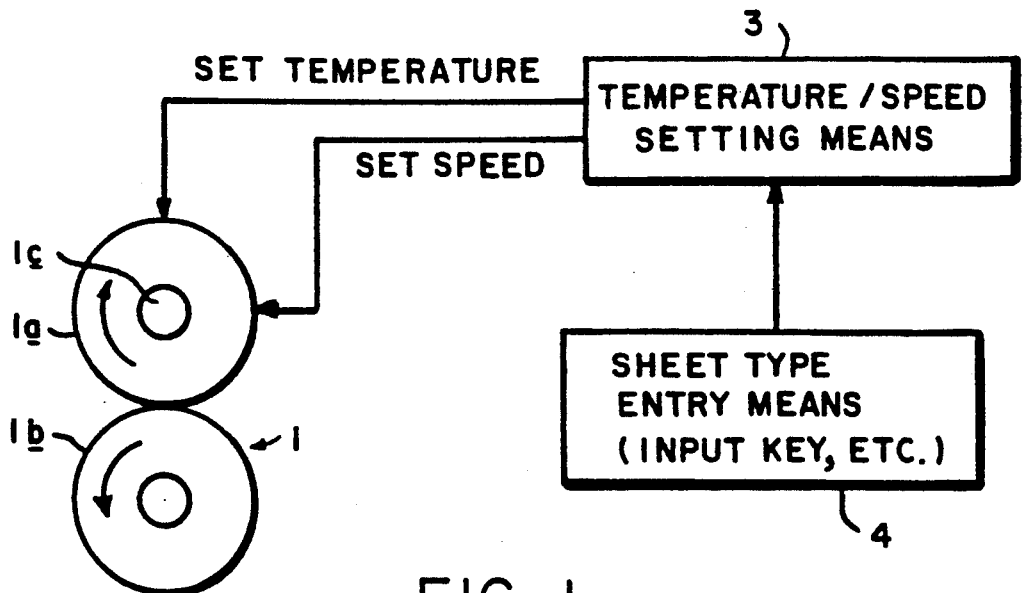
FIG. 1 shows an example of the constitution of the invention.

Now referring to the drawing, preferred embodiments of the invention are described below.

FIG. 1 shows the constitution of the invention. An image glossing device 1 is provided with upper and lower rollers 1a, 1b. The upper roller 1a is equipped with a heater 1c installed inside. Type of the receiver sheet is entered through a sheet type entry means 4 which consists of a key pad, an operating button or the like. A temperature/speed setting means 3 is used to set the temperature and speed of the image glossing device 1 in accordance to the type of sheet, to control the apparatus.

Figure 2:
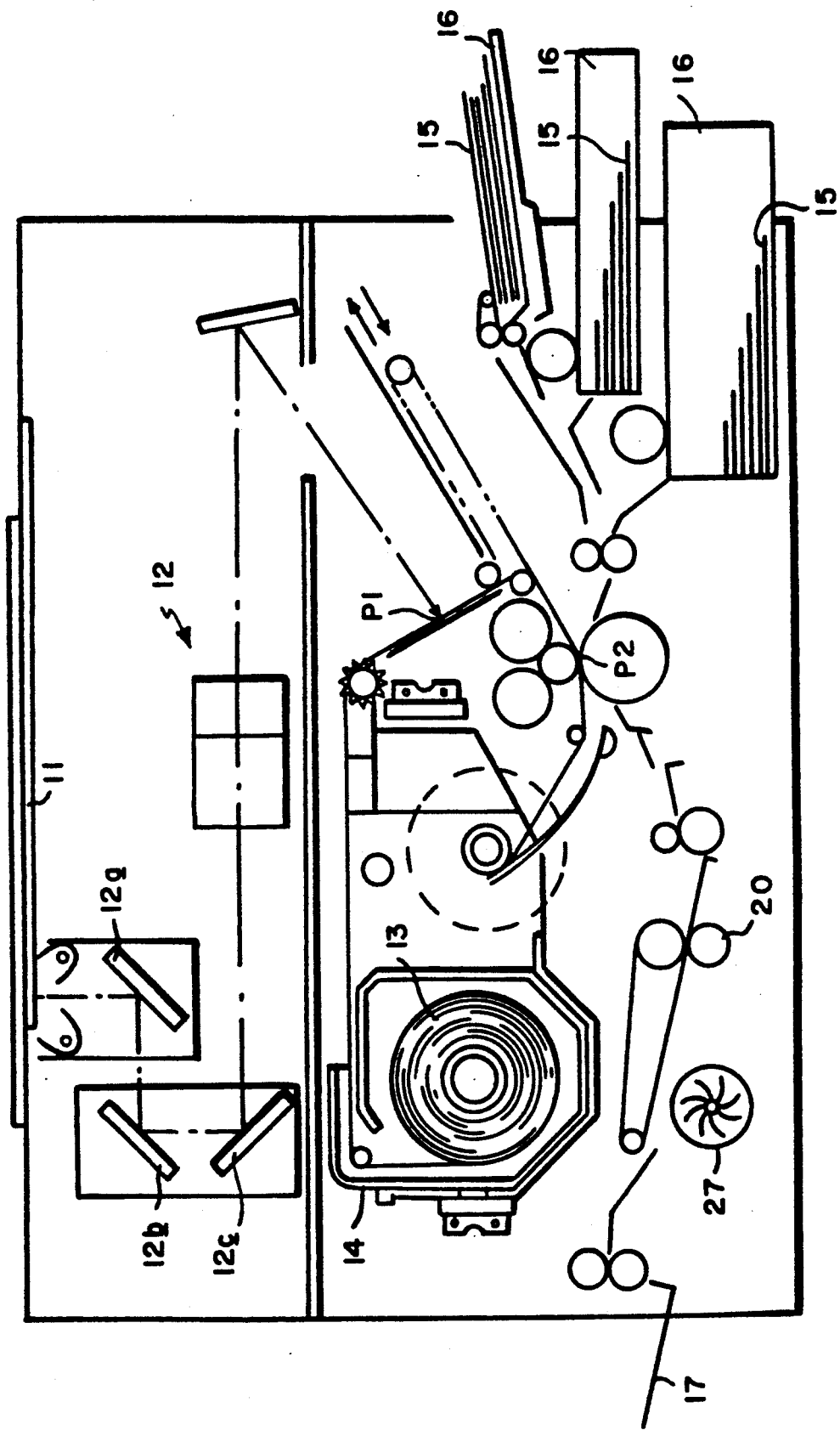
FIG. 2 is a cross-sectional drawing of a copying apparatus of an embodiment of the invention illustrative of the entire constitution.

FIG. 2 shows a schematic constitution of the copying apparatus of the embodiment of the invention.

Disposed on top of the copying apparatus is a document stage 11 made of a transparent hard glass plate upon which original documents to be copied are placed. Disposed below the document stage 11 is an optical system 12 similar to those used in ordinary copying apparatus. The optical system 12 guides the light reflected from the document surface via a plurality of mirrors 12a, 12b and 12c to an exposure section which will be described later. A medium sheet 13 is rolled and housed in a medium cartridge 14 which is made of an opaque material, and is fed to the exposure section P1 then to a pressure-developing section P2.

Figure 3:
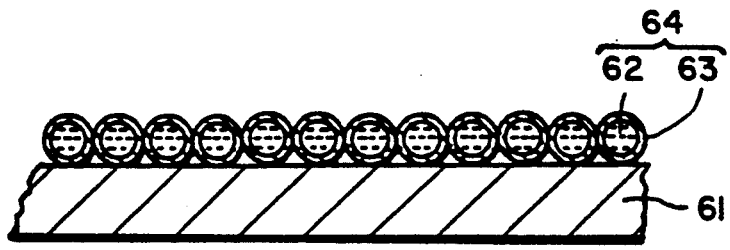
FIG. 3 is a schematic cross-sectional drawing of the medium sheet.

FIG. 3 is a schematic cross-sectional drawing of the medium sheet 13. The medium sheet consists of a light-reflecting metal sheet 61 such as aluminum, the surface thereof is coated with multitude of microcapsules 64 which contain leuco dye 62 and are coated with photo-hardenable material 63. Diameters of the microcapsules 64 range from 10 to 20 micrometers. The leuco dye 62 is a colorless precursor of, for example, crystal violet which has the first structural formula;

$$[(CH_3)_2NC_6H_4]_2=C=C_6H_4=N(CH_3)_2Cl \quad (1)$$

or malachite green which has the second structural formula;

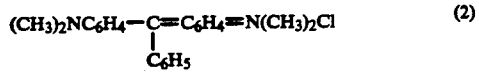

$$(CH_3)_2NC_6H_4-\underset{\underset{C_6H_5}{|}}{C}=C_6H_4=N(CH_3)_2Cl \quad (2)$$

When oxidized, the leuco dye 62 develops its intrinsic color. As the photohardenable material 63, ethylenically unsaturated acrylic ester of a polyhydric alcohol such as trimethylolpropane triacrylate may be used. By means of the microcapsules 64 which contain a photohardenable material 63, latent image of an original image can be formed on the medium sheet 13. Color image can also be processed by devising the photohardenable material 63 so that it hardens in response to light of particular wavelengths which does not include the color developed by the leuco dye 62.

The medium sheet 13 is exposed to light which is reflected on the surface of the original document in the exposure section P1 to form a latent image, and is pressed with a receiver sheet stacked thereon in the pressure-developing section P2.

Figure 4:
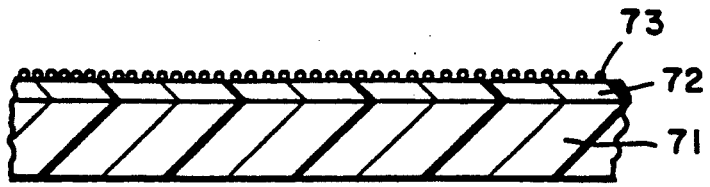
FIG. 4 is a schematic cross-sectional drawing of the receiver sheet.

FIG. 4 is a schematic cross-sectional drawing of the receiver sheet 15. The receiver sheets 15 in the form of cut sheets are housed in a paper cartridge 16 which is detachably provided in the right side of the copying apparatus. The receiver sheet 15 consists of a sheet-like support 71 which is coated with a developer material 72 and a thermoplastic resin 73 on one side thereof. The support 71 may be plain paper or transparent sheet for overhead projectors (called OHP hereinafter). The developer material 72 may be attapulgite clay or an acid such as phenol resin. The thermoplastic resin 73 is applied onto the surface of the receiver sheet 15 in the form of emulsion or latex and, after drying, forms a discontinuous layer of fine particles of diameters not greater than 1 micrometer.

Stacking of the receiver sheet 15 on the medium sheet 13 is carried out so that their coated surfaces come into contact with each other. The microcapsules 64 on the medium sheet 13 are broken by pressurization on condition that the photohardenable material 63 is not yet hardened. Upon feeding of the receiver sheet 15 at the timing of overlying it on the latent image formed on the medium sheet 13, color forming leuco dye is transferred onto the receiver sheet 13 in the pressure-developing section P2. The receiver sheet 13 is then transferred to the image glossing device 20 where the sheet is subject to glossing process and is air-cooled by means of a cooling fan 27 and, upon completion of the process, is discharged onto a discharge tray 17. The paper cartridges 16 house receiver sheets of different type or size respectively.

Figure 5:
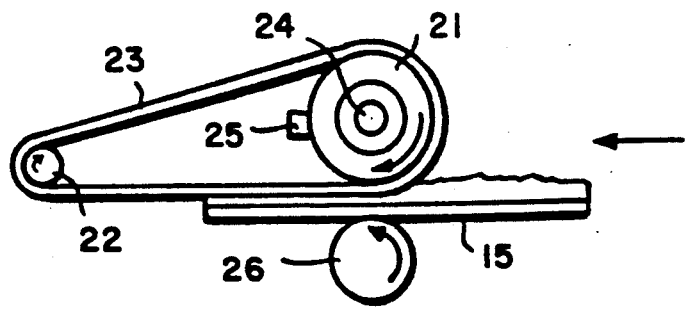
FIG. 5 shows the constitution of the image glossing device.

FIG. 5 shows the constitution of the image glossing device. An endless glossing belt 23 made of polyimide resin is extended between a cylindrical heat roller 21 and a separator roller 22 which has a smaller diameter than that of the heat roller 21. The heat roller 21 is connected to a main motor of the imaging apparatus via a clutch, and rotates in the direction indicated by the arrow in the figure. The rotating speed of the heat roller 21 is controlled by means of a set of transmission gears and corresponds to the glossing speed of the invention. The heat roller 21 is provided with a heater 24 such as halogen-tungsten lamp or the like installed inside thereof which heats the heat roller 21 to a temperature required for glossing. Reference No. 25 indicates a temperature sensor which detects the surface temperature of the heat roller 21. As the temperature sensor 25, a thermistor which has low heat capacity and shows great changes in the resistance in the heating temperature range from 100° to 200° C. is used. The temperature sensor 25 is fixed on the copying apparatus so that it makes contact with the surface of the heating roller 21 which is coated with teflon (tetrafluoroethylene). The temperature sensor 25 is covered with kapton (polyimide) resin to improve the wear-resistance.

A tension roller 26 is pressurized to contact with the heat roller 21 via the glossing belt 23. The receiver sheet 15 with the dye placed thereon passes between the glossing belt 23 and the tension roller 26, while being heated and pressurized to promote the color development and to render gloss to the image by means of the thermoplastic resin. Then the receiver sheet 15 moves to the left along the glossing belt as shown in the figure. The receiver sheet 15 is gradually cooled by the cooling fan 27 and is separated from the glossing belt 23 at the position of the separator roller 22. At this point, since the sheet temperature has lowered sufficiently to prevent sticking of the resin and other materials of the sheet surface onto the glossing belt 23.

While a glossing device which employs the glossing belt 23 is shown in this embodiment, it may be a device consisting solely of rollers without belt as shown in FIG. 1.

Figure 6:
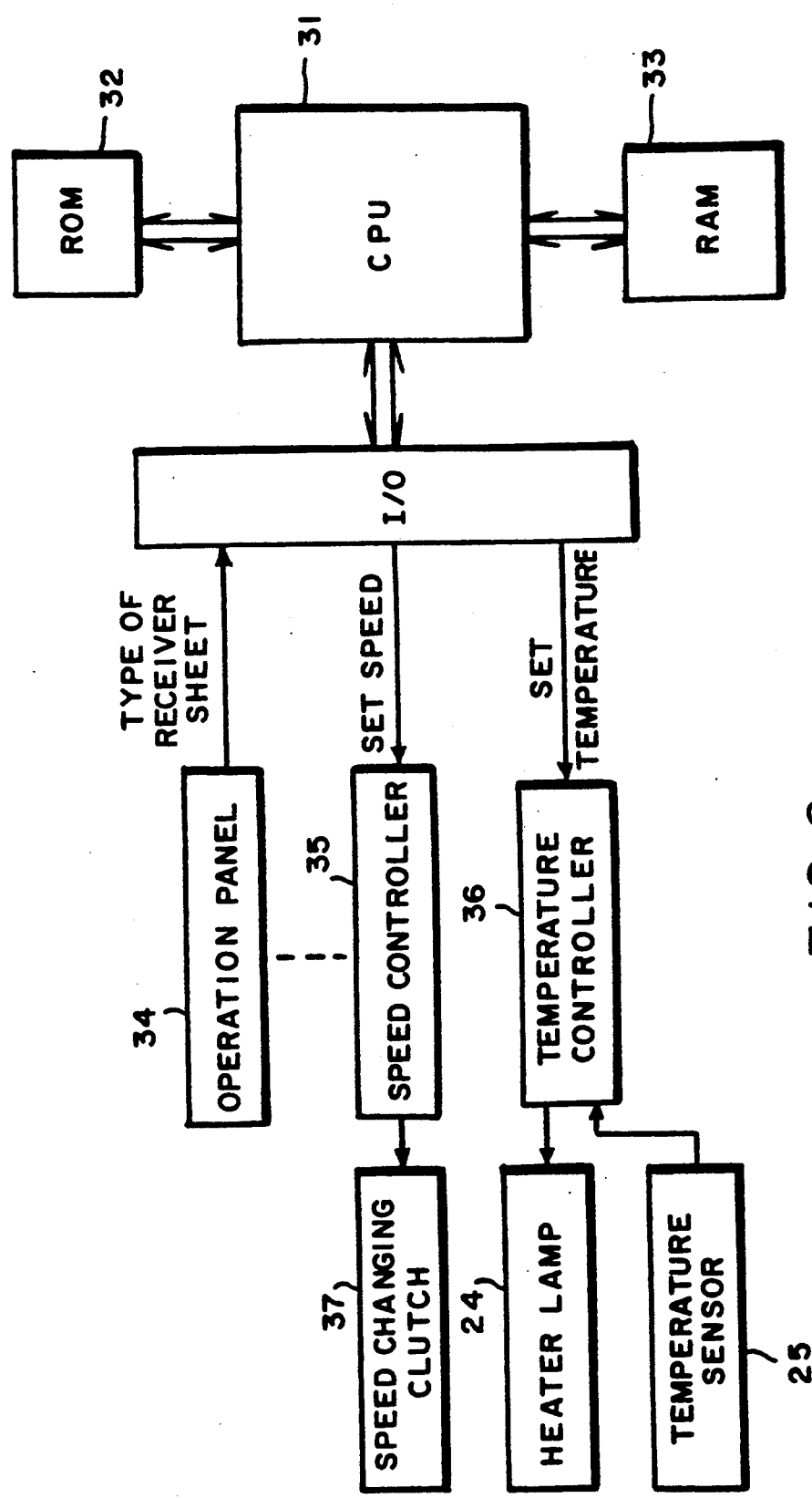
FIG. 6 is a block diagram of a major section of the copying apparatus of an embodiment of the invention.

FIG. 6 is a block diagram of a major part of the copying apparatus of the invention. The entire copying apparatus is controlled by a CPU 31. The CPU 31 receives data from an input section and issues movement commands to moving parts in accordance with the control program stored in a ROM 32. A RAM 33 provides a working memory area during operation. Provided on top of the copying apparatus is an operation panel 34 which contains a button to input the type of receiver sheet, namely the kind of material and the thickness thereof. The ROM 32 stores the temperatures and speeds to be selected in accordance to the types of the sheet during glossing process, to allow the data to be sent to a speed controller 35 and to a temperature controller 36. The speed controller 35 controls the speed changing clutch 37 which is connected to the heat roller 21 in accordance to a set speed value to determine the rotating speed. The temperature controller 36 controls the heater lamp 24 while comparing the output data of the temperature sensor 25 to a set temperature value, to regulate the temperature. Selection of the temperature and speed in accordance with the kind of sheet is performed to supply the sheet a sufficient quantity of heat for glossing and to prevent occurrence of the offset and a significant drop in the processing speed from taking place. For example, the temperature and the speed may be determined or set as follows.

When the receiver sheet is plain paper:
Temperature: 140°–150° C.
Speed: 31.5 mm/sec.
When the receiver sheet is OHP
Temperature: 150°–160° C.
Speed: 11 to 12 mm/sec.

This glossing speed is identical with the pressure-development speed.

For a thin receiver sheet, processing speed can be increased by determining or setting the temperature higher and the speed faster than the setting shown in the above example. For a thick receiver sheet, satisfactory glossing can be performed without causing the offset by setting the temperature lower and the speed slower than the setting shown in the above example.

Figure 7:
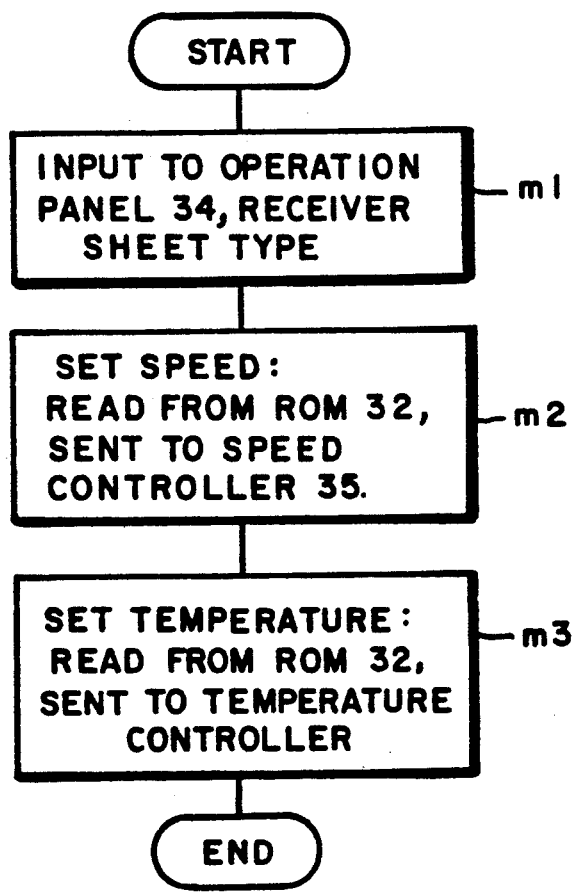
FIG. 7 is a flowchart explanatory of the control process in the embodiment shown in FIG. 6.

FIG. 7 is a flow chart explanatory of the control process in the invention. First, the type of receiver sheet, namely the kind of material and the thickness, is entered through the operation panel 34 in step m1. In step m2, the CPU 31 read the data of preset speed for the material of the receiver sheet and sends the data to the speed controller 35. In step m3, the CPU 31 reads the data of the preset temperature for the material of the receiver sheet and sends the data to the temperature controller 36. This procedure sets the processing speed and the heating temperature of the glossing process.

Figure 8:
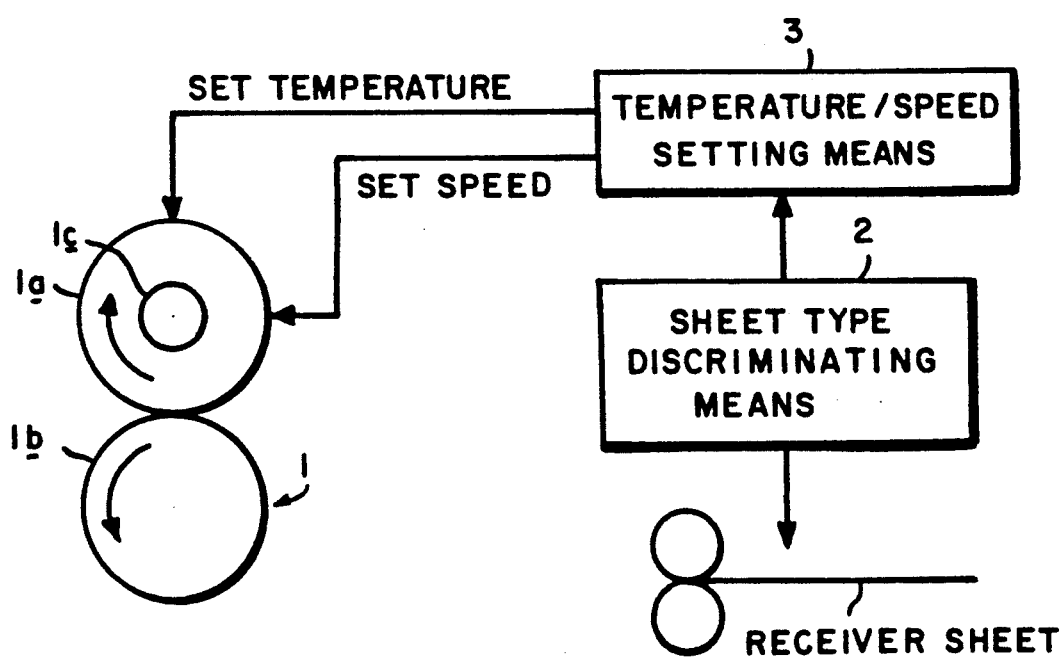
FIG. 8 shows the constitution of another embodiment of the invention.

FIG. 8 shows the constitution of another embodiment of the invention. A temperature/speed setting means 3 sets or determines the temperature and processing speed of the image glossing device in accordance to the type of sheet which is detected by the sheet type detecting means 2, to control the glossing device. The sheet type detecting means 2 consists of, for example, a photosensor or devices which senses the capacitance, resistance or other electric characteristics of the sheet. The rest of the constitution of the image glossing device 1 is the same as that shown in FIG. 1.

Figure 9:
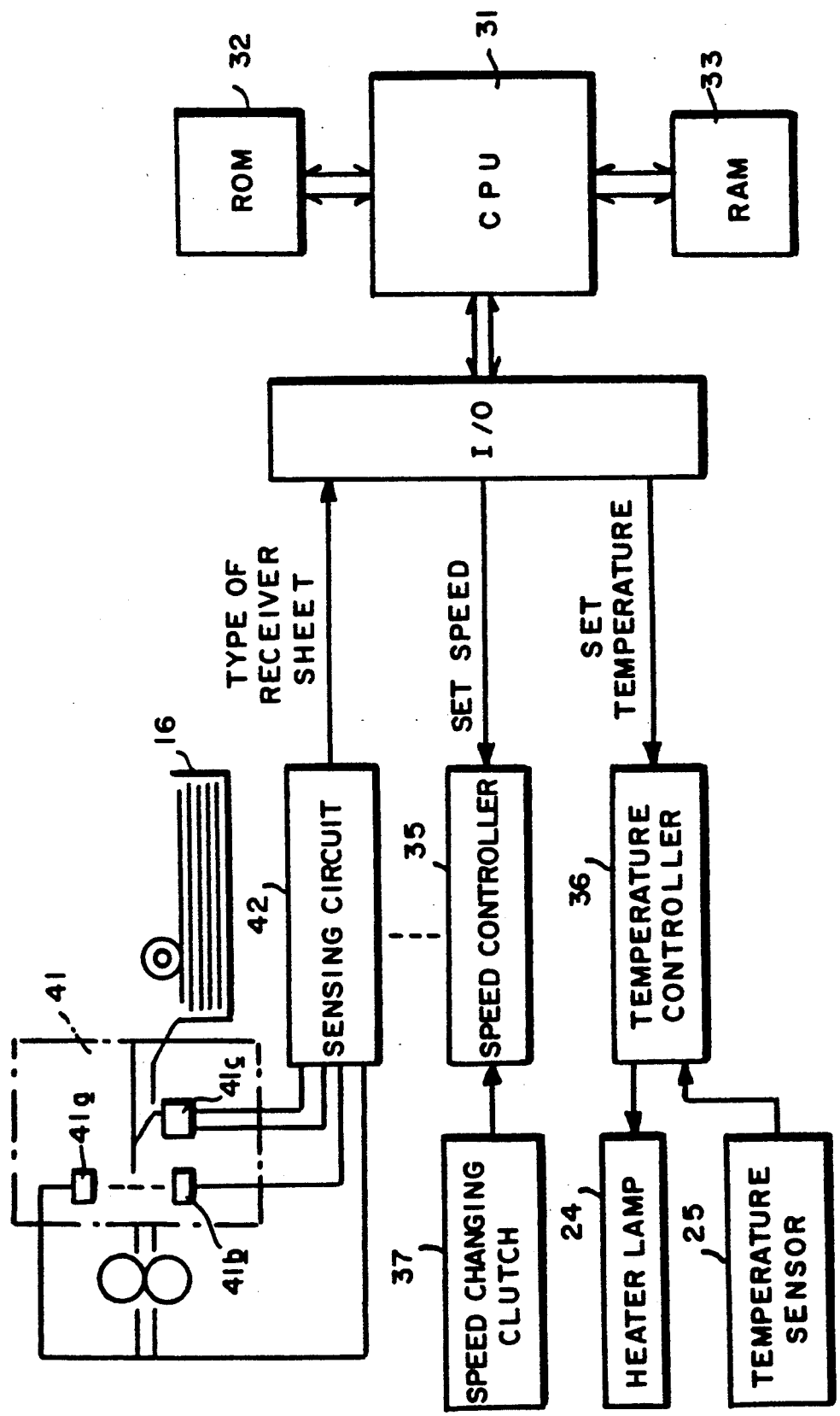
FIG. 9 is a block diagram of a major section of the copying apparatus of another embodiment of the invention.

FIG. 9 is a block diagram of a major part of another embodiment of the invention in accordance to the constitution shown in FIG. 8. In this embodiment, the apparatus is provided with a device 41 which senses the light transmission of the receiver sheet 13 during the period when the receiver sheet moves from the paper cartridge 16 to the pressure-developing section P2. The light transmission sensing device 41 has a light emitting element 41a consisting of a light-emitting diode and a light receiving element 41b consisting of a photodiode, and senses the light transmission of of receiver sheet 13 which is fed. For example, in case the receiver sheet 13 is OHP, most of the light is incident on the light receiving element 41b and, in case the receiver sheet is plain paper, light intensity incident on the light receiving element varies corresponding to the thickness of the sheet. Type of the receiver sheet is identified from the received light intensity by a sensing circuit 42 and is entered to the CPU 31. 41c is a micro switch which senses whether a receiver sheet is fed or not.

In this embodiment, the rest of the constitution, for example the document stage 11, optical system 12, light exposure section P1 and pressure-developing section P2, is identical with that of the embodiment shown in FIG. 2.

Figure 10:
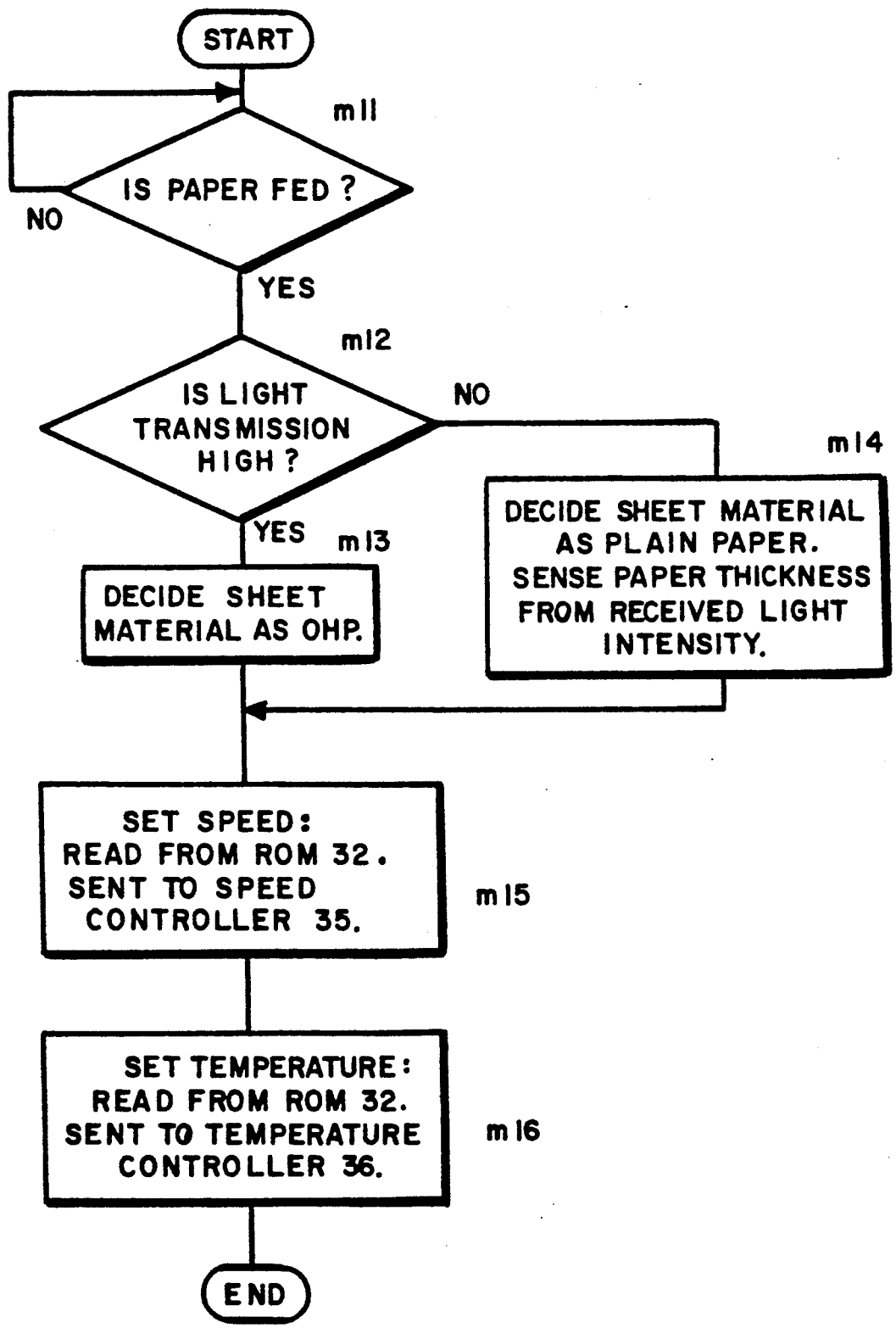
FIG. 10 is a flowchart explanatory of the control process in the embodiment shown in FIG. 9.

FIG. 10 is a flow chart explanatory of the control process in the embodiment shown in FIG. 9. First, the micro switch 41c senses whether the receiver sheet 13 is fed or not in step m11. When it is sensed that the receiver sheet has been fed, the control proceeds to step m12 and the light transmission of the receiver sheet 13 is detected. If the measured light transmission is high, the control proceeds to step m13 and the sheet is decided to be OHP. If the measured light transmission is low, the control proceeds to step m14 and the sheet is decided to be plain paper, and the sheet thickness is obtained from the output of the light receiving element 41b. The following procedures of setting the speed and temperature in step m15 and m16 are identical with those in step m2 and step m3 shown in FIG. 7, respectively.

Figure 11:
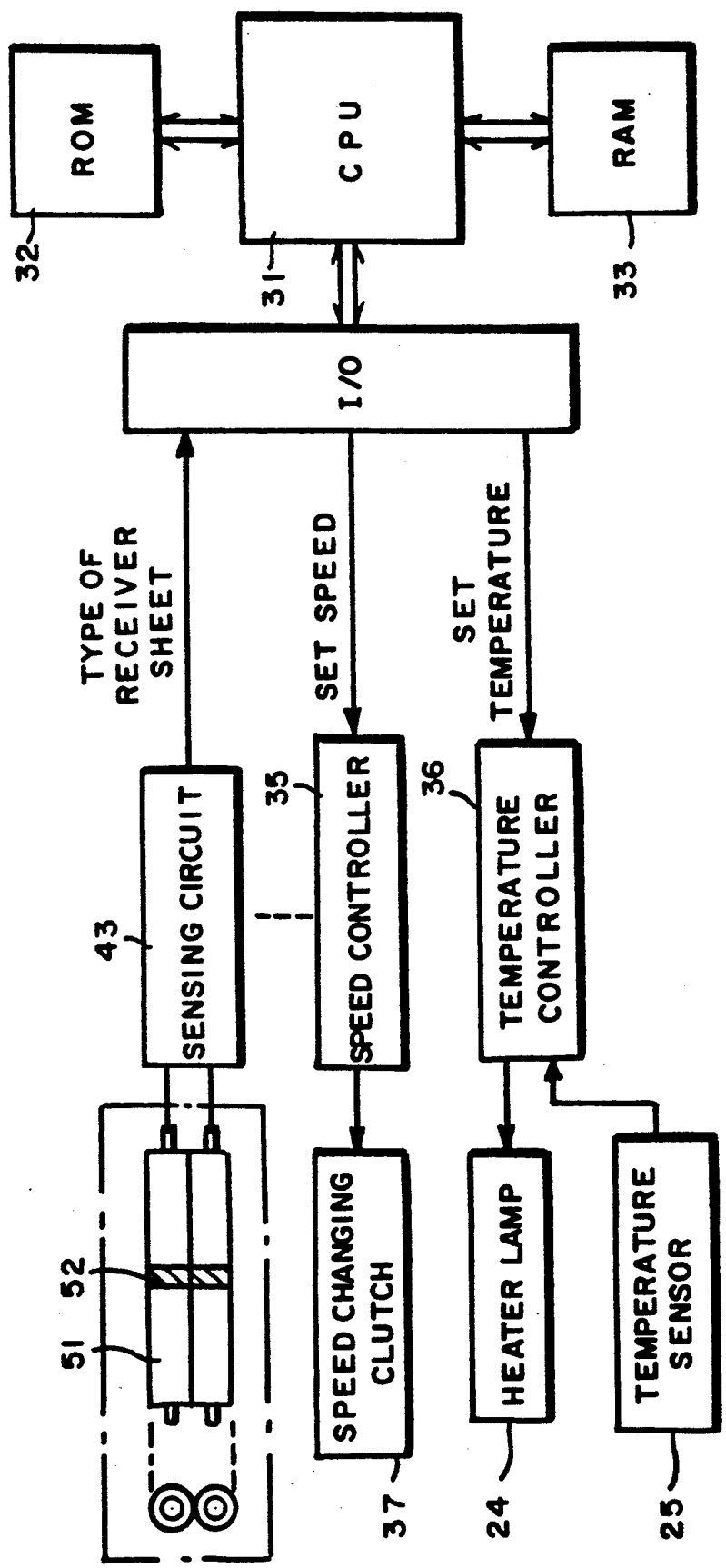
FIG. 11 is a block diagram of a major section of the copying apparatus of further another embodiment of the invention.

FIG. 11 is a block diagram of a major part of further another embodiment of the invention in accordance to the constitution shown in FIG. 8. In this embodiment, a device 52 which detects the capacitance or the resistance of the receiver sheet 13 is attached to timing roller 51 which feed the receiver sheet 13 at a proper timing to the pressure-developing section P2. The device 52 includes a pair of electrodes which are mounted on the surface of the timing rollers 51. Because the capacitance and the resistance vary corresponding to the kind of material and the thickness of the receiver sheet, the type of the receiver sheet can be detected by sensing these electric characteristics. The sensing circuit 43 is a device which identifies the type of the receiver sheet from the measured capacitance and/or resistance. The rest of the constitution of this embodiment, for example the optical system 12 and the light exposure section P1, is identical with that of the embodiment shown in FIG. 2.

Figure 12:
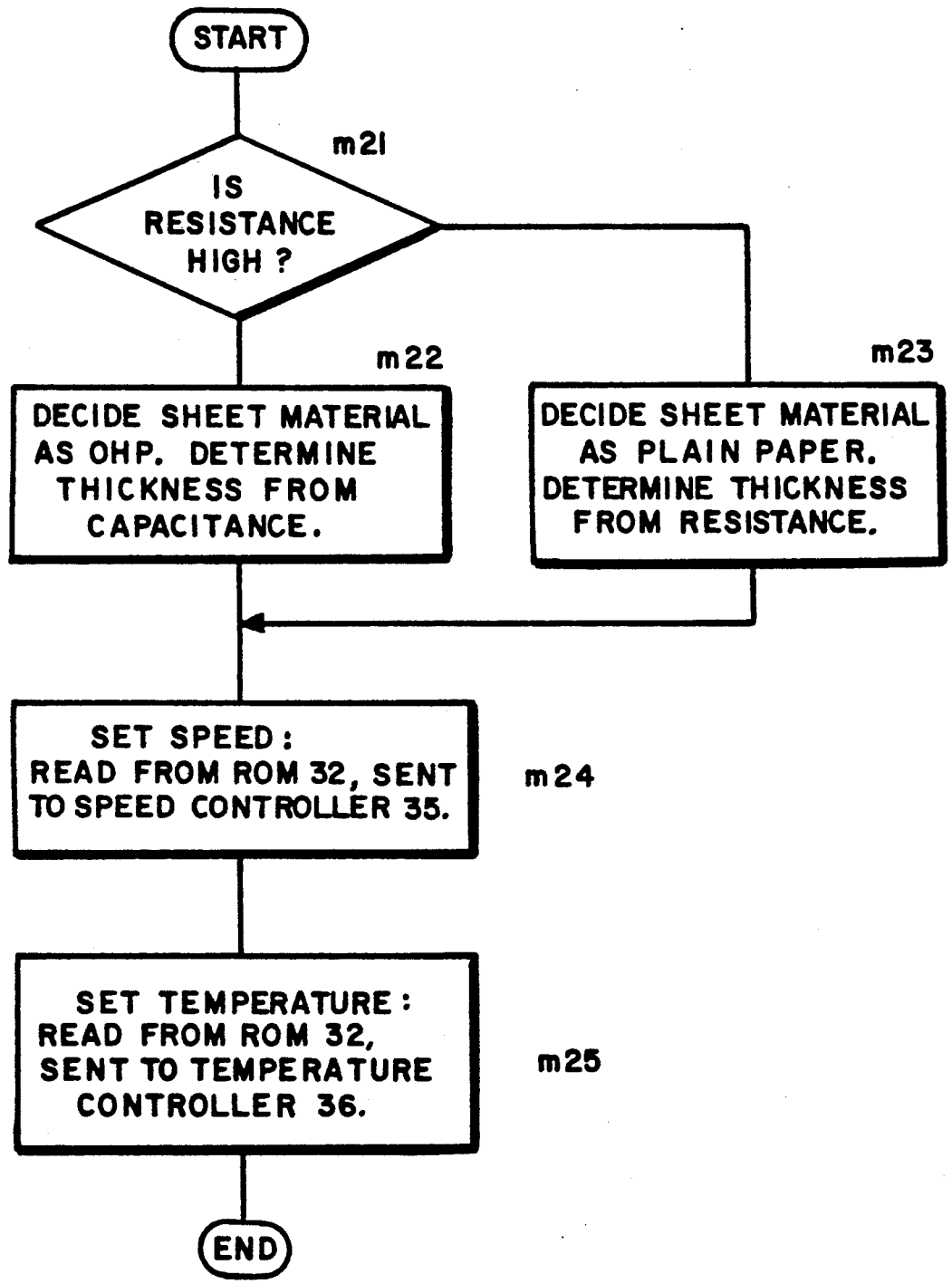
FIG. 12 is a flowchart explanatory of the control process in the embodiment shown in FIG. 11.

FIG. 12 is a flow chart explanatory of the control process of the embodiment shown in FIG. 11. First, in step m21, the resistance between the timing rollers 51 is measured. When the resistance is high, the sheet is decided to be OHP and the control proceeds to step m22, where the capacitance between the electrodes mounted on the timing rollers 51 is measured to obtain the thickness of the OHP. If the resistance measured in step 21 is low, the sheet is decided to be plain paper and the control proceeds to step m23 where the thickness is obtained from the value of resistance. The sensing and detecting processes in the steps m21 through m23 are carried out by the device 42. The following procedures of setting the speed and the temperature in steps m24 and m25 are identical with those in steps m2 and m3 shown in FIG. 7, respectively.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An imaging apparatus in which, after a development process, a receiver sheet is transferred through an image glossing device and is heated to promote color formation of a chromogenic material and to fuse thermoplastic resin, and in which a high gloss image is formed on the receiver sheet, wherein the improvement comprises:

means for inputting a receiver sheet for transfer through said image glossing device;

means for detecting a type of the inputted receiver sheet; and means for determining a transfer speed, corresponding to the type of the receiver sheet, at which to transfer the receiver sheet through the image glossing device and a temperature, corresponding to the type of the receiver sheet, at which to heat the receiver sheet in the image glossing device.

2. An imaging apparatus according to claim 1, wherein the inputting means comprises an input operating button for selecting a type of the receiver sheet to be transferred and/or a thickness of the receiver sheet.

3. An imaging apparatus according to claim 1, wherein the detecting means comprises means for detecting light transmission through the receiver sheet to determine the type of the receiver sheet.

4. An imaging apparatus according to claim 3 wherein said light transmission detecting means is a photosensor.

5. An imaging apparatus according to claim 1, wherein the detecting means comprises a device for detecting electric characteristics of the receiver sheet to determine the type of receiver sheet.

6. An imaging apparatus according to claim 5 where said electric characteristics detecting means detects the capacitance and the resistance of the receiver sheet.

7. An imaging apparatus according to claim 1 wherein the image glossing device includes a pair of rollers having a rotating speed for transferring the receiver sheet through said image glossing device, said rollers heating and pressing the receiver sheet during the transfer therethrough;

means responsive to said detecting means for determining the transfer speed corresponding to the type of receiver sheet which is being transferred; and means for controlling the rotating speed of said pair of rollers in accordance with said determined transfer speed so as to transfer the receiver sheet through the image glossing device at said determined transfer speed.

8. An imaging apparatus according to claim 7, wherein the image glossing device further comprises:

a separator roller disposed at a certain distance from the pair of rollers in a transferring direction of the receiver sheet, said separator roller having a diameter smaller than that of one of the pair of rollers; and a glossing belt extended between the separator roller and the one of the pair of rollers.

9. An imaging apparatus according to claim 1 wherein said detecting means directly detects a selected characteristic of the receiver sheet itself.

* * * * *